United States Patent
Trenkler

(10) Patent No.: US 7,629,055 B2
(45) Date of Patent: Dec. 8, 2009

(54) PROTECTIVE COATING SYSTEM FOR REFLECTIVE OPTICAL ELEMENTS, REFLECTIVE OPTICAL ELEMENT AND METHOD FOR THE PRODUCTION THEREOF

(75) Inventor: Johann Trenkler, Schwähisch Gmünd (DE)

(73) Assignee: Carl Zeiss SMT AG, Oberkochen (DE)

( * ) Notice: Subject to any disclaimer, the term of this patent is extended or adjusted under 35 U.S.C. 154(b) by 452 days.

(21) Appl. No.: 11/150,740

(22) Filed: Jun. 10, 2005

(65) Prior Publication Data

US 2005/0276988 A1   Dec. 15, 2005

Related U.S. Application Data

(63) Continuation-in-part of application No. PCT/EP03/13686, filed on Dec. 4, 2003.

(30) Foreign Application Priority Data

Dec. 12, 2002   (DE) ................................ 102 58 709

(51) Int. Cl.
*B32B 9/00* (2006.01)
(52) U.S. Cl. .................... 428/469; 428/698; 428/701; 428/702
(58) Field of Classification Search ................ None
See application file for complete search history.

(56) References Cited

U.S. PATENT DOCUMENTS

| | | | |
|---|---|---|---|
| 5,958,605 A | 9/1999 | Montcalm et al. | |
| 6,228,512 B1 * | 5/2001 | Bajt et al. | 428/635 |
| 6,449,086 B1 | 9/2002 | Singh | |
| 6,664,554 B2 * | 12/2003 | Klebanoff et al. | 250/505.1 |
| 6,724,462 B1 * | 4/2004 | Singh et al. | 355/53 |
| 2002/0012797 A1 * | 1/2002 | Bijkerk et al. | 428/408 |
| 2003/0008180 A1 * | 1/2003 | Bajt et al. | 428/698 |

FOREIGN PATENT DOCUMENTS

| | | |
|---|---|---|
| EP | 1 150 139 | 10/2001 |
| WO | WO 03/032329 | 4/2003 |

OTHER PUBLICATIONS

XP008017154—Improved Reflectance and Stability of Mo/Si multilayers, S. Bajt, et al., SPIE vol. 4506 (2001) pp. 65-75.
XP-002219427—Capping layers for extreme-ultraviolet multilayer interference coatings, M. Singh, et al., Optics Letters, Mar. 1, 2001, vol. 26, No. 5, pp. 259-261.

* cited by examiner

*Primary Examiner*—Timothy M Speer
(74) *Attorney, Agent, or Firm*—Sughrue Mion, PLLC

(57) ABSTRACT

A limiting factor in the operation of EUV lithographic devices is the lifetime or the reflectivity of the reflective optics that is reduced by contamination with carbon-containing substances. Protective coatings that are resistant to oxidation or are inert against water are already known.

According to the invention it is proposed to deposit protective coatings on, for example, multilayers that suppress the growth of carbon-containing substances in combination with layers that are inert against residual gas atmosphere and energy input. Even with a long operating time a high reflectivity is thereby retained.

The protective coatings may be deposited by electron-beam vaporization, magnetron- or ion-beam sputtering.

23 Claims, 4 Drawing Sheets though the influence of oxygen. Contamination by carbon-containing substances does, however, still occur. These cause uncontrolled reflectivity losses and wave front changes. Cleaning cycles must therefore still be performed. The cleaning cycles not only increase the hold-up times, but also harbor the risk of the deterioration of the layer homogeneity of the multilayer or the risk of increasing the surface roughness. This also causes reflectivity losses.

PROTECTIVE COATING SYSTEM FOR REFLECTIVE OPTICAL ELEMENTS, REFLECTIVE OPTICAL ELEMENT AND METHOD FOR THE PRODUCTION THEREOF

CROSS REFERENCE

This application is a continuation-in-part application of International Application No. PCT/EP03/013686, filed Dec. 4, 2003 and published as WO 2004/053540 on Jun. 24, 2004, which claims the priority to German Application No. 102 58 709.4, filed Dec. 12, 2002.

FIELD OF THE INVENTION

The invention relates to a protective coating system for reflective optical elements for the EUV and soft X-ray wavelength range. In addition, the invention relates to a reflective optical element for the EUV and soft X-ray wavelength range. Furthermore, the invention relates to a method for the production of a reflective optical element for the EUV and soft X-ray wavelength range and a method for the production of a protective coating system.

BACKGROUND AND PRIOR ART

Reflective optical elements for the EUV and soft X-ray wavelength range may, for example, be multilayers. Multilayers are assembled from periodical repetitions, whereby in the simplest case one period consists of two layers. One layer material should preferably show a high real part of the refractive index, while the other layer material should show a low real part of the refractive index. The layer with the high real part of the refractive index is also called spacer; the layer with the small real part of the refractive index is also called absorber. The thickness of the period as well as the thickness of the individual layers is chosen depending upon the operating wavelength, so that the reflectivity is maximized at this operating wavelength.

Multilayers are used, for example, in EUV lithographic devices for the production of semiconductor devices. During operation, the multilayers are exposed to both a radiation of up to 20 mW/mm² EUV photon density or more and a relatively high portion of residual gas of water, oxygen, and hydrocarbons. The residual gases are broken down to reactive cleavage products, which cause degradation and contamination of the multilayer surface, by irradiation with EUV photons or secondary electrons or by the influence of external electrical fields. These contaminations cause imaging defects. In the worst case, an image is completely prevented by them. During the operation of the multilayer, cleaning cycles have therefore to be arranged. These significantly increase the operational costs.

In U.S. Pat. No. 6,228,512 B1 it is proposed to allow for a protective coating of $SiO_2$, $Zr_2O$, or ZnO that does not react with water, on a MoRu/Be-multilayer. ZnO in particular is recommended, since during the deposition of Zn an only 0.5 to 0.6 nm thick intrinsic ZnO-layer is formed, that sufficiently protects the multilayer against oxidation without—due to its low thickness—significantly deteriorating the reflectivity.

In U.S. Pat. No. 5,958,605 a special protective coating system for EUV-multilayer is proposed, in which a lower layer of silicon or beryllium is allowed for, that is directly deposited on the multilayer, and at least one upper layer, that on its part is deposited on the lower layer, whereby this upper layer comprises a material that is resistant against oxidation and corrosion and also protects the underlying layers against oxidation.

The protective coatings according to U.S. Pat. Nos. 5,958,605 and 6,228,512 B1 give in fact protection against aging through the influence of oxygen. Contamination by carbon-containing substances does, however, still occur. These cause uncontrolled reflectivity losses and wave front changes. Cleaning cycles must therefore still be performed. The cleaning cycles not only increase the hold-up times, but also harbor the risk of the deterioration of the layer homogeneity of the multilayer or the risk of increasing the surface roughness. This also causes reflectivity losses.

Against this background it is the object of the invention to provide a reflective optical element for the EUV and soft X-ray wavelength range or a corresponding protective coating system, so that the lifetime is increased and the hold-up times are decreased.

SUMMARY OF THE INVENTION

In a first aspect of the present invention, a protective coating system for reflective optical elements for the EUV and soft X-ray range is provided, with an upper coating system that comprises at least one uppermost layer made of one of the group consisting of an aluminum oxide, a beryllium aluminum oxide, a beryllium magnesium aluminum oxide, a titanium oxide, a magnesium oxide, a magnesium aluminum oxide, a manganese oxide, a nickel aluminum oxide, a sodium titanium oxide, an antimony oxide, a cerium titanium oxide, a cerium oxide, a strontium oxide, a zirconium oxide, a yttrium oxide, a rhodium oxide, a hafnium oxide, a ruthenium oxide, a boron oxide, a beryllium oxide, a calcium titanium oxide, a silicon nitride, a boron nitride, a silicon oxide, and a silicon carbide, on which the overgrowth of carbon-containing substances is suppressed, and a lower coating system, that comprises at least one layer made of one of the group consisting of $B_xC_y$, $Mo_xB_y$, $B_xN_y$, $Si_xN_y$, $Si_xC_y$, $Be_xO_y$, $Si_xO_y$, Ti, $Ti_xN_y$, $Cu_xAu_y$, Ni, Ru, Rh, Ir, Au, Pd, Pt, Os, Sm, Gd, $Al_xO_y$, $K_xCl_y$, K, Hf, $Th_xF_y$, $Na_xF_y$, $Li_xF_y$, $Mg_xF_y$, $La_xF_y$, amorphous carbon, Y, Nb, $Rh_xO_y$, $Ru_xO_y$, Ce, and $Si_xH_y$, that is inert against energy input and against residual gas atmosphere. This does not include the particular case of the protective coating system consisting of one layer of a ruthenium oxide as upper coating system and one layer of ruthenium and one layer of $B_4C$ as lower coating system.

It will be noted, that with thin layers such as in the protective coating system according to the present invention precise stoichiometric data are only conditionally meaningful.

In a further aspect of the present invention, a reflective optical element for the EUV and soft X-ray wavelength range with such a protective coating system is provided.

In still a further aspect of the present invention, a method for the production of a reflective optical element according to the present invention is provided, in which the protective coating system is deposited by electron-beam vaporization and/or magnetron sputtering and/or ion-beam sputtering.

In a last aspect of the present invention, a method for the production of a protective coating system according to the present invention is provided, in which the protective coating system is deposited by electron-beam vaporization and/or magnetron sputtering and/or ion-beam sputtering.

BRIEF DESCRIPTION OF THE INVENTION

The invention should be explained in more detail with the following examples. For that purpose, in the Figures FIG. 1 shows a drawing of a multilayer with protective coating system;

DETAILED DESCRIPTION OF THE INVENTION

Figure 1:
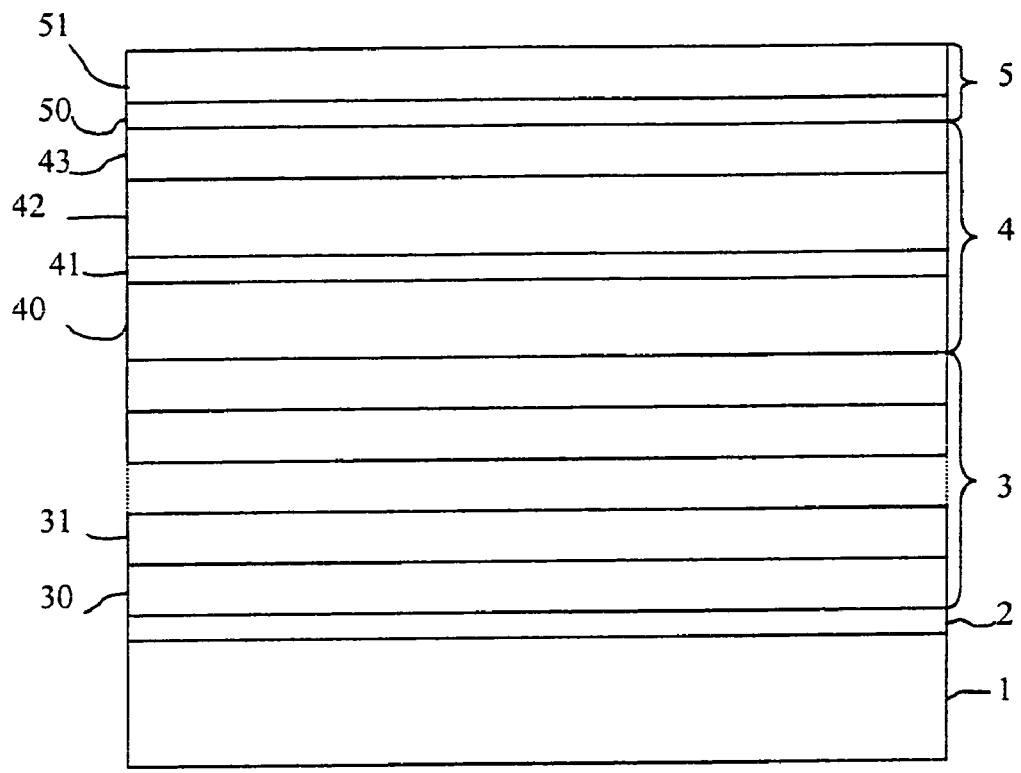

It was found, that certain materials show a low affinity to carbon-containing substances, in other words, to which carbon-containing layers adhere only with a low probability or show a low adsorption rate. With these materials the overgrowth of carbon-containing substances is also drastically decreased or suppressed. It emerged, that such materials can be used as protective coating for reflective optical elements for the EUV and soft X-ray wavelength range without showing significant negative effects on the optical behavior of the reflective optical element.

Preferably, the at least one uppermost layer is inert against external electromagnetic fields. This decreases the probability of spontaneous electronic emissions that, on their parts, can break up the residual gases into reactive cleavage products. Thereby, in addition, the deposition of contamination on the protective layer system is decreased. The inertness against external electromagnetic fields can be influenced, for example, by a surface showing a roughness that is as small as possible and/or by the use of materials that show a large band gap between valence band and conductor band.

According to the present invention, the protective coating system has an upper coating system and a lower coating system. The upper coating system thereby comprises at least the carbon-growth poor layer (=layer on which the overgrowth of carbon-containing substances is suppressed). The lower coating comprises at least one layer that is inert against energy input and residual gas atmosphere. Under inertness against energy input is here to be understood inertness against irradiation with photons and electrons as well as against the influence of external electrical fields. Under inertness against residual gas atmosphere is to be understood that this layer reacts with only a low probability with the cleavage products of the residual gas atmosphere or that these cleavage products do not deposit itself. Through combination of the two coating systems an additional significant increase in the lifetime of the multilayers with simultaneous increase of the operating time between two cleaning cycles is achieved.

In particular, if the reflective optical element is a multilayer, the optical thickness of the protective coating system should advantageously be adjusted to the optical thickness of a period of the multilayer. Thereby reflectivity losses, that are too high, are avoided by the protective coating system. The optical thickness is thereby through the layer thicknesses and optical indices directly dependent on the operating wavelength of the optical element. Additionally, a minimum thickness has to be complied with so that a closed, homogeneous layer is formed during deposition.

In this context it proved to be advantageous, if the upper coating system shows a thickness of 0.7 nm to 9 nm. The lower coating system should show a thickness between 1 nm and 16 nm.

The at least one carbon-growth poor layer preferably shows a real part of the refractive index in the operating wavelength range between 0.84 and 0.98. The imaginary part should be as small as possible, so that the absorption is as low as possible. The optical thickness of the carbon-growth poor layer or the upper coating system thus lies between the properties of the spacer material and the properties of the absorber material of a multilayer, but can also correspond to the optical thickness of a spacer- or absorber material. The at least one inert layer of the lower coating system should, on the other hand, have a real part of the refractive index in the operating wavelength range between 0.84 and 0.98. The refractive index of the inert layer should also have an imaginary part that is as small as possible. The observance of these optical boundary conditions results in a decreased reflectivity loss, which would initially occur through the deposition of a protective coating system.

In a preferred embodiment, the reflective optical element that is provided with a protective coating system according to the invention concerns a multilayer situated on a substrate.

It preferably concerns a molybdenum/silicon-, molybdenum/beryllium-, molybdenum carbide/silicon-, or a molybdenum carbide/beryllium-, molybdenum carbide/beryllium-multilayer. With multilayers on that basis, especially high reflectivities can be obtained in the EUV and soft X-ray wavelength range. The multilayers can have intermediate layers made of $Mo_xSi_y$ or $Be_xMo_y$, which are formed by interdiffusion or chemically. In order to slightly increase the lifetime and the reflectivity as well as the contrast of a multilayer, it can be of advantage to have a multilayer with at least one intermediate layer made of BN, $B_4C$, C, or $Si_3N_4$ that acts as diffusion barrier between the actual layers of the multilayer. Through diffusion an at least partial mixing of the layers can occur, for example in the form of $Mo/B_4C/Si$ in $Mo/Mo_wB_xC_ySi_z/Si$.

The reflective optical element preferably shows a maximum reflectivity at an operating wavelength between 11.0 nm and 15 nm.

The period of a multilayer preferably shows a thickness of 5.0 nm to 18 nm.

The reflective optical element advantageously shows a maximum reflectivity of >55%.

According to the invention, the reflective optical element or the protective coating system is produced by deposition of the protective coating system through electron-beam vaporization and/or magnetron sputtering and/or ion-beam sputtering. If the reflective optical element is a multilayer, it is of advantage to also deposit it on a substrate through electron-beam vaporization and/or magnetron sputtering and/or ion-beam sputtering.

The protective coating system or the multilayer is preferably deposited under assistance of an ion beam, in order to obtain homogeneous layers and a low surface- and interface roughness.

In FIG. 1, the exemplary architecture of an optical reflective element with a protective coating system according to the invention 4, 5 is shown. To a substrate 1 is deposited, after an intermediate layer 2, a multilayer 3 which consists of N-periods of an absorber 30 and a spacer 31.

On the multilayer 3 is initially deposited a lower coating system 4, that is resistant against the irradiation with photons and electrons in the presence or absence of external electrical fields in a residual gas atmosphere. This lower coating system 4 consists, in the present case, of four individual layers 40-43. Of central importance for maximum reflectivity are the layers 40 and 42, which show the function of an absorber layer 40 and a spacer layer 42. Between layer 40 and layer 42 is either a through diffusion formed intermediate layer 41 or a diffusion barrier 41. The uppermost layer 43 of the lower coating system 4 can have either spacer- or absorber function. At least the layer 43 consists of an inert material in the present example.

Above the lower coating system 4 consisting of layers 40-43, is deposited an upper coating system 5 consisting of, in this case, two layers 50 and 51. Optically, both layers 1 and 2 show properties between a spacer and an absorber. At least layer 51 consists of a carbon-growth poor material. The upper protective coating system is facing the vacuum. The optical thickness of the protective coating system 4, 5 consisting of the layers 40-43, 50, 51 lies close to the optical thickness of a multilayer period consisting of the layers 30 and 31. A minimum thickness is to be observed for each layer so that a closed, homogeneous layer is formed during deposition.

EXAMPLE 1

Figure 2:
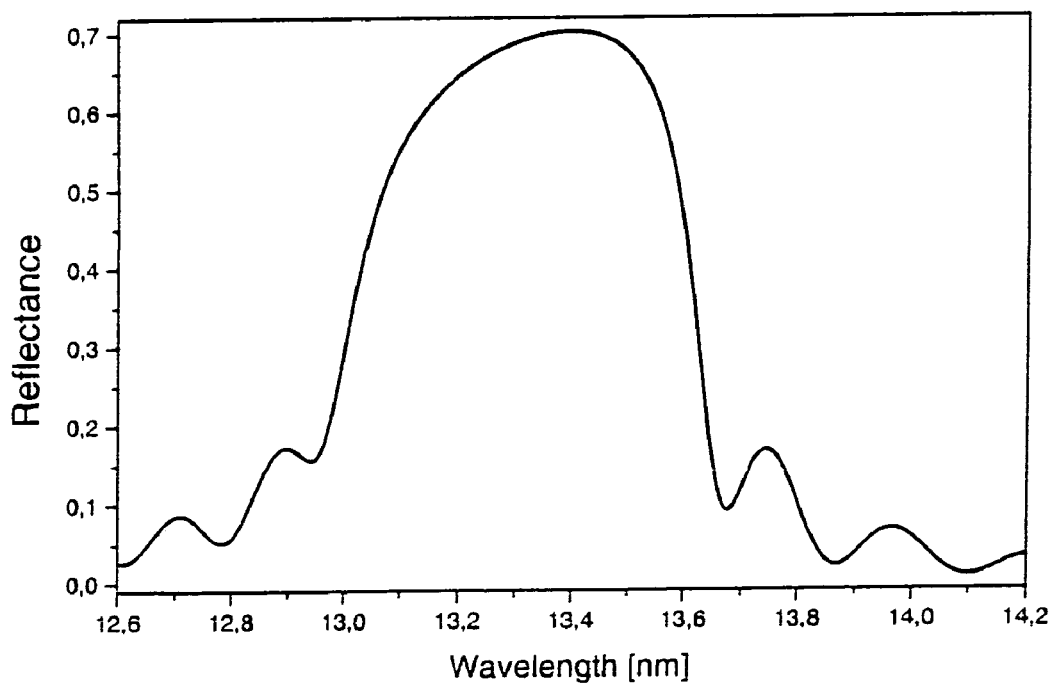
FIG. 2 shows the reflectivity curve for a first exemplary embodiment.

A multilayer of 50 periods of Mo(2.74 nm)/Si(4.11 nm) on an amorphous $SiO_2$-substrate was provided with a protective coating system. This protective coating system comprises an upper protective coating system made of an aluminum oxide layer of a thickness of 1.29 nm and a lower coating system made of $Rh_2O_3$(1.3 nm)/Y(1.5 nm)/amorphous C(1.35 nm)/ Ce(1.11 nm). The rhodium oxide layer is the inert material layer, which assumes the function of an absorber. The yttrium layer, together with the cerium layer, corresponds to a spacer layer. The total thickness of yttrium and cerium is optimized for maximum reflectivity. The amorphous carbon layer serves as diffusion barrier. The yttrium layer and the cerium layer are also inert. At an angle of incidence of 0 degree to the surface normal and an operating wavelength of 13.4 nm under neglect of the surface- and interface roughness a maximum reflectivity of 70.3% (refer to FIG. 2) is obtained. Even after operation under residual gas atmosphere for 60 hours, the multilayer with protective coating system still shows a maximum reflectivity of 97.5% of the initial reflectivity at 13.4 nm.

EXAMPLE 2

Figure 3:
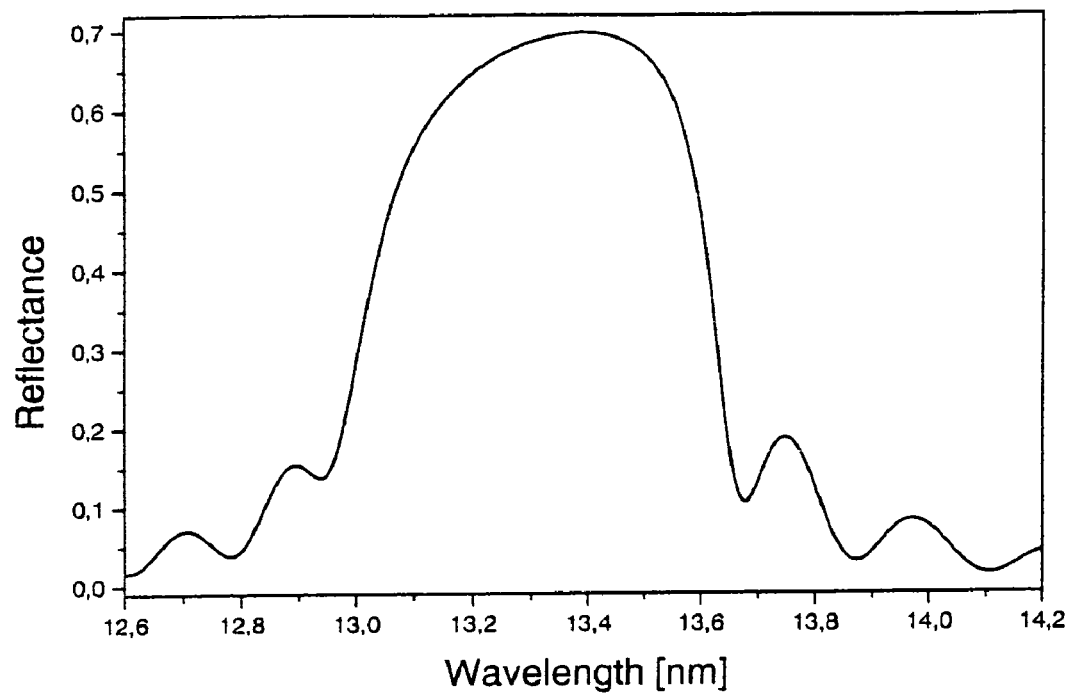
FIG. 3 shows the reflectivity curve for a second exemplary embodiment.

It concerns a multilayer of 50 periods of Mo(2.74 nm)/ amorphous Si(4.11 nm) which is deposited on an amorphous $SiO_2$-substrate. This multilayer shows an upper coating system of an $Y_2O_3$(0.84 nm)-layer as carbon-growth poor material as well as a lower coating system of Y(3.36 nm)/$Y_2O_3$ (0.84 nm)/Y(3.36 nm)/$Y_2O_3$(0.84 nm)/Y(3.36 nm). The $Y_2O_3$-layers suppress the growth of carbon-containing substances; the Y-layers are inert. The yttrium layers assume optically the function of a spacer, while the yttrium oxide layers assume the function of an absorber. At an angle of incidence of 0 degree to the surface normal and an operating wavelength of 13.4 nm under neglect of the surface- and interface roughness a reflectivity of 69.8% (refer to FIG. 3) is obtained. After irradiation for 65 hours under normal operating conditions the multilayer still shows a reflectivity of 97.0% of the initial reflectivity.

EXAMPLE 3

Figure 4:
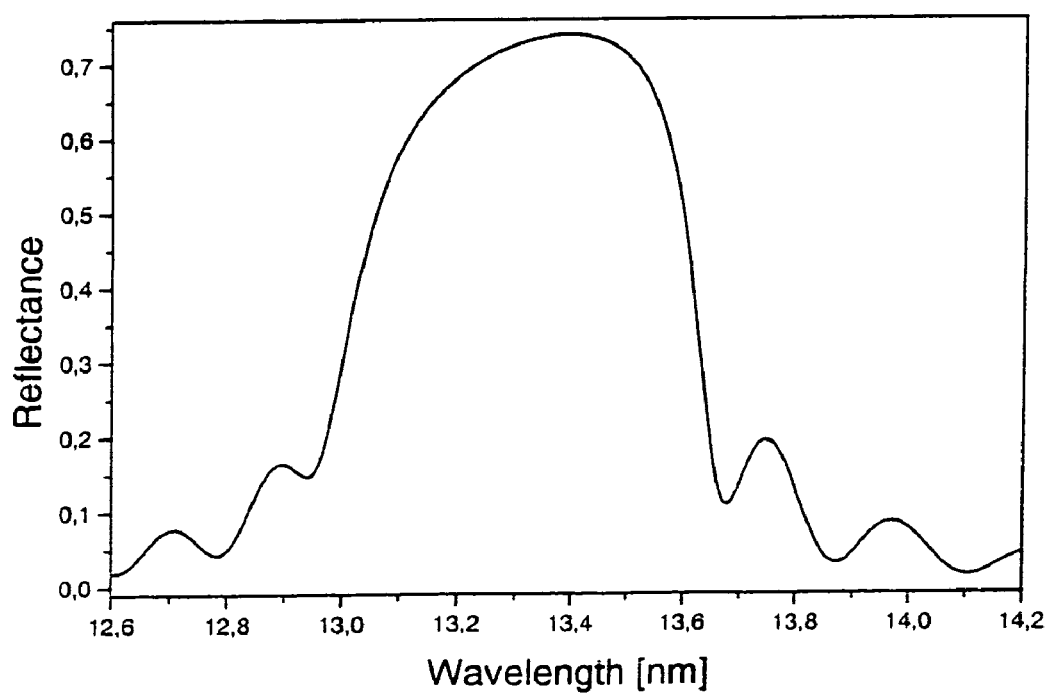
FIG. 4 shows the reflectivity curve for a third exemplary embodiment.

On a multilayer of 50 periods of Mo(2.74 nm)/amorphous Si(3.66 nm), which is deposited on an amorphous $SiO_2$-substrate, is located a protective coating system consisting of an upper coating system of the one layer of $Y_2O_3$(1.93 nm) as well as a lower coating system of the one layer of Y(3.58 nm), whereby the yttrium oxide layer shows a low adsorption rate for carbon-containing substances and is also inert. The yttrium layer has optically the function of a spacer, while the yttrium oxide layer assumes the function of an absorber. At an angle of incidence of 0 degree to the surface normal and an operating wavelength of 13.4 nm under neglect of the surface- and interface roughness a reflectivity of 73.3% (refer to FIG. 4) is obtained. After irradiation under normal operating conditions for 40 hours the multilayer still shows a reflectivity of 98.5% of the initial reflectivity.

EXAMPLE 4

Figure 5:
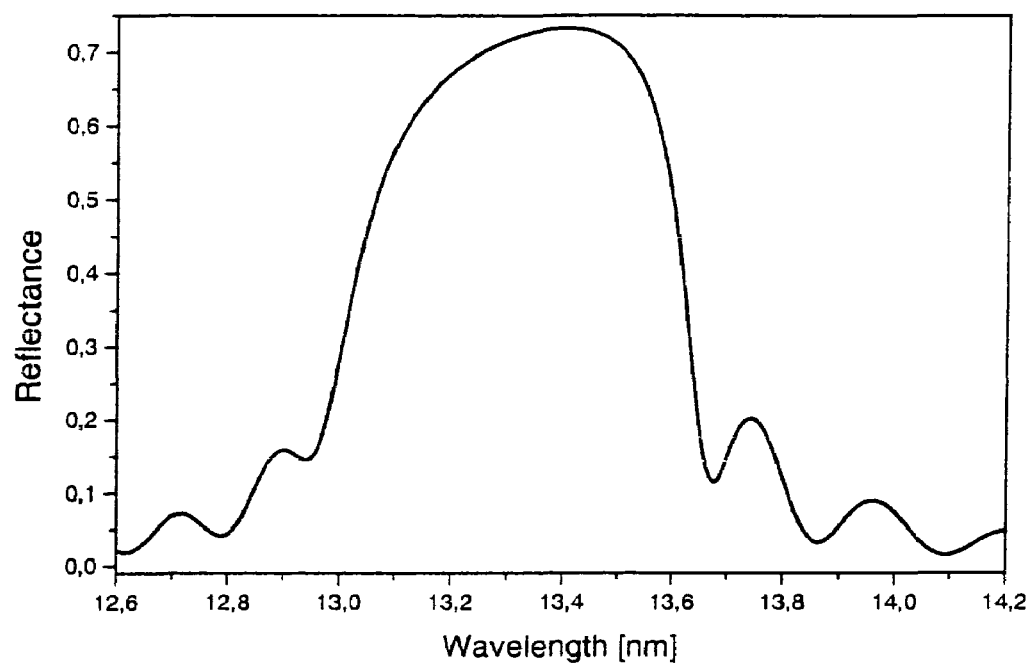
FIG. 5 shows the reflectivity curve for a fourth exemplary embodiment.

A multilayer of 50 periods of amorphous Si(4.11 nm)/Mo (2.74 nm) on an amorphous $SiO_2$-substrate is provided with a protective coating system. This protective coating system comprises an upper coating system of $ZrO_2$(1.8 nm)/amorphous Si(1.5 nm)/amorphous SiC(2.5 nm) and a lower coating system of a Nb(2.7 nm)-layer. The niobium layer is the inert material layer. The zirconium oxide layer suppresses the growth of carbon-containing substances, while the amorphous Si— and the amorphous SiC-layer serve as spacer of the optical adjustment of the protective coating system to the multilayer. At an angle of incidence of 0 degree to the surface normal and an operating wavelength of 13.4 nm a maximum reflectivity of 73.3% (refer to FIG. 5) is obtained. Even after operation under residual gas atmosphere for 60 hours, the multilayer with protective coating system still shows a maximum reflectivity of 98% of the initial reflectivity at 13.4 nm.

EXAMPLE 5

Figure 6:
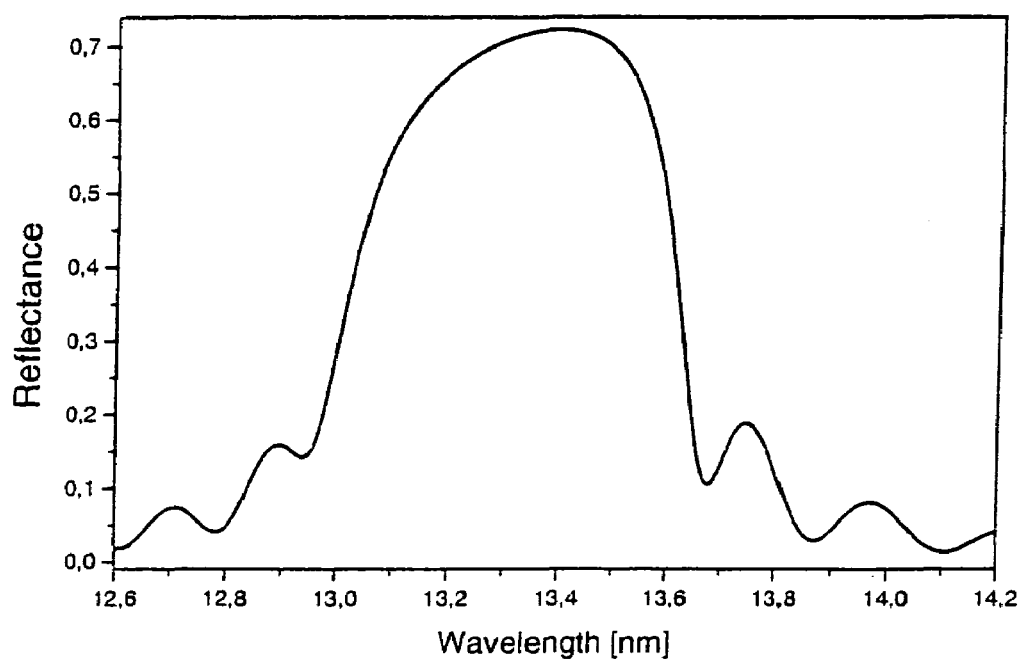
FIG. 6 shows the reflectivity curve for a fifth exemplary embodiment.

A multilayer of 50 periods of Mo(2.74)/amorphous Si(4.11 nm) on an amorphous $SiO_2$-substrate was provided with a protective coating system. This protective coating system comprises an upper protective coating system made of a zirconium oxide layer with a thickness of 2.26 nm and a lower coating system made of a zirconium layer with a thickness of 3.69 nm. The zirconium layer is the inert material layer, while the zirconium oxide layer shows a low adsorption rate for carbon-containing substances. Zirconium oxide, by the way, shows a low probability for spontaneous electron emissions under the influence of external electrical fields. In order to additionally suppress the spontaneous electron emissions, the zirconium oxide layer was ion-beam polished. At an angle of incidence of 0 degree to the surface normal and an operating wavelength of 13.4 nm under neglect of the surface- and interface roughness a maximum reflectivity of 72.4% (refer to FIG. 6) is obtained. Even after operation under residual gas atmosphere for 50 hours, the multilayer with protective coating system still shows a maximum reflectivity of 98.4% of the initial reflectivity at 13.4 nm.

Figure 7:
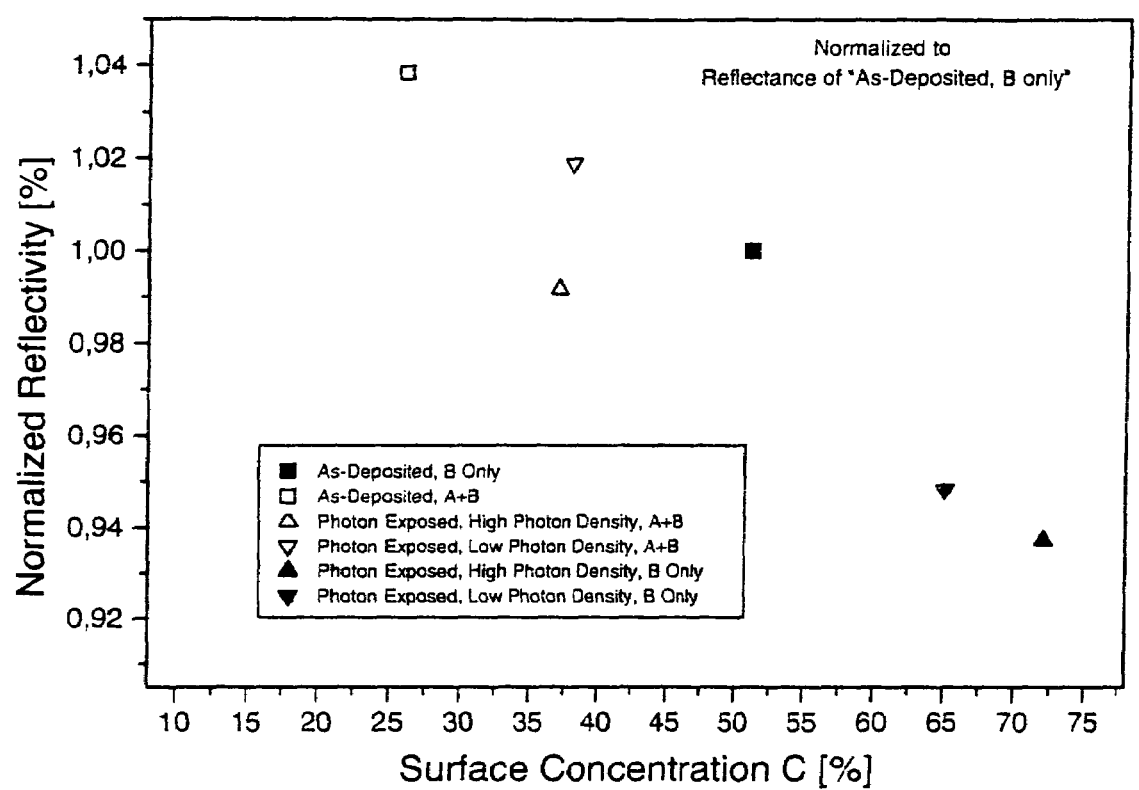
FIG. 7 shows the reflectivity change at certain degrees of contamination.

In FIG. 7, the reflectivity versus the degree of contamination is contrasted for multilayers with a protective coating system according to the invention (open symbols) and identical multilayers with a protective coating according to the state of the art that is resistant to oxidation (black symbols). The shown reflectivity is the relative reflectivity, whereby a relative reflectivity of 1 corresponds to a not yet irradiated multilayer with a protective coating according to the state of the art.

The square corresponds to a not yet irradiated multilayer with a protective coating system according to the invention (open) or a conventional protective coating (black). The triangles with a vertex pointing upward correspond to an irradiation with EUV-photons (13.4 nm) of high intensity for 60 h, and the triangles with a vertex pointing downward correspond to an irradiation with EUV-photons (13.4 nm) for 60 h at low intensity.

As one recognizes, the multilayer with a protective coating system according to the invention initially shows a lower carbon contamination and a higher reflectivity, since the contaminating influence of the atmosphere is already lower during the assembly. Even after irradiation for 60 h at low intensity it still shows a higher reflectivity than a conventional multilayer before irradiation. Only after 60 h of irradiation the reflectivity drops below the one of a non-irradiated conventional multilayer. Compared to irradiated conventional multilayers, the multilayers with protective coating system according to the invention show a 2-4% higher reflectivity. The degree of contamination is also lower. Through the use of the protective coating according to the invention the lifetime of the multilayer thus overall increases and the number of cleaning procedures can be decreased which results in fewer downtimes.

The invention claimed is:

1. A protective coating system for reflective optical elements for the EUV and soft X-ray range, comprising: an upper coating system having a thickness of 0.7 nm to 9 nm that comprises at least one uppermost layer made of one of the group consisting of an aluminum oxide, a beryllium aluminum oxide, a beryllium magnesium aluminum oxide, a titanium oxide, a magnesium oxide, a magnesium aluminum oxide, a manganese oxide, a nickel aluminum oxide, a sodium titanium oxide, an antimony oxide, a cerium titanium oxide, a cerium oxide, a strontium oxide, a zirconium oxide, a yttrium oxide, a rhodium oxide, a hafnium oxide, a ruthenium oxide, a boron oxide, a beryllium oxide, a calcium titanium oxide, a silicon nitride, a boron nitride, a silicon oxide, and a silicon carbide, and a lower coating system having a thickness of 1 nm to 16 nm that comprises at least one layer made of one of the group consisting of $B_xC_y$, $Mo_xB_y$, $B_xN_y$, $Si_xN_y$, $Si_xC_y$, $Be_xO_y$, $Si_xO_y$, Ti, $Ti_xN_y$, $Cu_xAu_y$, Ni, Ru, Rh, Ir, Au, Pd, Pt, Os, Sm, Gd, $Al_xO_y$, $K_xCl_y$, K, Hf, $Th_xF_y$, $Na_xF_y$, $Li_xF_y$, $Mg_xF_y$, $La_xF_y$, amorphous carbon, Y, Nb, $Rh_xO_y$, $Ru_xO_y$, Ce, and $Si_xH_y$, wherein the protective coating system consists of one layer of a ruthenium oxide as upper coating system, a one layer of ruthenium or one layer of $B_4C$ as the lower coating system are excluded.

2. The protective coating system according to claim 1, wherein the at least one uppermost layer is inert against external electromagnetic fields.

3. The protective coating system according to claim 2, wherein the optical thickness of the protective coating system is adjusted to the optical thickness of the reflective optical element.

4. The protective coating system according to claim 2, wherein the at least one uppermost layer shows a real part of the refractive index between 0.84 and 0.98.

5. The protective coating system according to claim 2, wherein the at least one inert layer of the lower coating system shows a real part of the refractive index between 0.84 and 0.98.

6. The protective coating system according to claim 1, wherein the optical thickness of the protective coating system is adjusted to the optical thickness of the reflective optical element.

7. The protective coating system according to claim 1, wherein the at least one uppermost layer shows a real part of the refractive index between 0.84 and 0.98.

8. The protective coating system according to claim 1, wherein the at least one inert layer of the lower coating system shows a real part of the refractive index between 0.84 and 0.98.

9. A reflective optical element for the EUV and soft X-ray wavelength range, comprising: a protective coating system comprising an upper coating system having a thickness of 0.7 nm to 9 nm that comprises at least one uppermost layer made of one of the group consisting of an aluminum oxide, a beryllium aluminum oxide, a beryllium magnesium aluminum oxide, a titanium oxide, a magnesium oxide, a magnesium aluminum oxide, a manganese oxide, a nickel aluminum oxide, a sodium titanium oxide, an antimony oxide, a cerium titanium oxide, a cerium oxide, a strontium oxide, a zirconium oxide, a yttrium oxide, a rhodium oxide, a hafnium oxide, a ruthenium oxide, a boron oxide, a beryllium oxide, a calcium titanium oxide, a silicon nitride, a boron nitride, a silicon oxide, and a silicon carbide, and a lower coating system having a thickness of 1 nm to 16 nm that comprises at least one layer made of one of the group consisting of $B_xC_y$, $Mo_xB_y$, $B_xN_y$, $Si_xN_y$, $Si_xC_y$, $Be_xO_y$, $Si_xO_y$, Ti, $Ti_xN_y$, $Cu_xAu_y$, Ni, Ru, Rh, Ir, Au, Pd, Pt, Os, Sm, Gd, $Al_xO_y$, $K_xCl_y$, K, Hf, $Th_xF_y$, $Na_xF_y$, $Li_xF_y$, $Mg_xF_y$, $La_xF_y$, amorphous carbon, Y, Nb, $Rh_xO_y$, $Ru_xO_y$, Ce, and $Si_xH_y$, except that when the protective coating system consists of one layer of a ruthenium oxide as upper coating system, a one layer of ruthenium or one layer of $B_4C$ as the lower coating system are excluded.

10. The reflective optical element according to claim 9, wherein the protective coating system is arranged on a multilayer that is situated on a substrate.

11. The reflective optical element according to claim 10, wherein the reflective optical element shows a maximum reflectivity between the wavelengths of 11.0 nm and 15.0 nm.

12. The reflective optical element according to claim 10, wherein the multilayer shows a period with a thickness of 5.0 nm to 18 nm.

13. The reflective optical element according to claim 10, wherein the reflective optical element shows a maximum reflectivity of >55%.

14. The reflective optical element according to claim 10, wherein the reflective optical element includes an additional layer between multilayer and substrate.

15. The reflective optical element according to claim 10, wherein the at least one uppermost layer is inert against external electromagnetic fields, or wherein the optical thickness of the protective coating system is adjusted to the optical thickness of the reflective optical element, or wherein the at least one uppermost layer shows a real part of the refractive index between 0.84 and 0.98, or wherein the at least one inert layer of the lower coating system shows a real part of the refractive index between 0.84 and 0.98, or combinations thereof.

16. The reflective optical element according to claim 15, wherein the multilayer comprises a Mo/Si-, a Mo/Be-, a $Mo_2C/Si$-, or a $Mo_2C/Be$-multilayer, or wherein the multilayer shows at least one intermediate layer, or wherein the reflective optical element shows a maximum reflectivity between the wavelengths of 11.0 nm and 15.0 nm, or wherein the multilayer shows a period with a thickness of 5.0 nm to 18 nm, or wherein the reflective optical element shows a maximum reflectivity of >55%, or wherein the reflective optical element shows an additional layer between multilayer and substrate, or combinations thereof.

17. The reflective optical element according to claim 10, wherein the multilayer comprises a Mo/Si-, a Mo/Be-, a $MO_2C/Si$-, or a $Mo_2C/Be$-multilayer.

18. The reflective optical element according to claim 17, wherein the multilayer shows at least one intermediate layer.

19. The reflective optical element according to claim 9, wherein the reflective optical element shows a maximum reflectivity between the wavelengths of 11.0 nm and 15.0 nm.

20. The reflective optical element according to claim 9, wherein the reflective optical element shows a maximum reflectivity of >55%.

21. The reflective optical element according to claim 9, wherein the at least one uppermost layer is inert against external electromagnetic fields, or wherein the optical thickness of the protective coating system is adjusted to the optical thickness of the reflective optical element, or wherein the at least one uppermost layer shows a real part of the refractive index between 0.84 and 0.98, or wherein the at least one inert layer of the lower coating system shows a real part of the refractive index between 0.84 and 0.98, or combinations thereof.

22. A protective coating system for reflective optical elements for the EUV and soft X-ray range, comprising: an upper coating system having a thickness of 0.7 nm to 9 nm that comprises at least one uppermost layer made of one of the group consisting of an aluminum oxide, a beryllium aluminum oxide, a beryllium magnesium aluminum oxide, a titanium oxide, a magnesium oxide, a magnesium aluminum oxide, a manganese oxide, a nickel aluminum oxide, a sodium titanium oxide, an antimony oxide, a cerium titanium oxide, a cerium oxide, a strontium oxide, a zirconium oxide, a yttrium oxide, a rhodium oxide, a hafnium oxide, a boron oxide, a beryllium oxide, a calcium titanium oxide, a silicon nitride, a boron nitride, a silicon oxide, and a silicon carbide, and a lower coating system having a thickness of 1 nm to 16 nm that comprises at least one layer made of one of the group consisting of $B_xC_y$ with $x \neq 4$ and $y \neq 1$, $Mo_xB_y$, $B_xN_y$, $Si_xN_y$, $Si_xC_y$, $Be_xO_y$, $Si_xO_y$, Ti, $Ti_xN_y$, $Cu_xAu_y$, Ni, Rh, Ir, Au, Pd, Pt, Os, Sm, Gd, $Al_xO_y$, $K_xCl_y$, K, Hf, $Th_xF_y$, $Na_xF_y$, $Li_xF_y$, $Mg_xF_y$, $La_xF_y$, amorphous carbon, Y, Nb, $Rh_xO_y$, $Ru_xO_y$, Ce, and $Si_xH_y$.

23. A reflective optical element for the EUV and soft X-ray wavelength range, comprising: a protective coating system comprising an upper coating system having a thickness of 0.7 nm to 9 nm that comprises at least one uppermost layer made of one of the group consisting of an aluminum oxide, a beryllium aluminum oxide, a beryllium magnesium aluminum oxide, a titanium oxide, a magnesium oxide, a magnesium aluminum oxide, a manganese oxide, a nickel aluminum oxide, a sodium titanium oxide, an antimony oxide, a cerium titanium oxide, a cerium oxide, a strontium oxide, a zirconium oxide, a yttrium oxide, a rhodium oxide, a hafnium oxide, a boron oxide, a beryllium oxide, a calcium titanium oxide, a silicon nitride, a boron nitride, a silicon oxide, and a silicon carbide, and a lower coating system having a thickness of 1 nm to 16 nm that comprises at least one layer made of one of the group consisting of $B_xC_y$ with $x \neq 4$ and $y \neq 1$, $Mo_xB_y$, $B_xN_y$, $Si_xN_y$, $Si_xC_y$, $Be_xO_y$, $Si_xO_y$, Ti, $Ti_xN_y$, $Cu_xAu_y$, Ni, Rh, Ir, Au, Pd, Pt, Os, Sm, Gd, $Al_xO_y$, $K_xCl_y$, K, Hf, $Th_xF_y$, $Na_xF_y$, $Li_xF_y$, $Mg_xF_y$, $La_xF_y$, amorphous carbon, Y, Nb, $Rh_xO_y$, $Ru_xO_y$, Ce, and $Si_xH_y$.

* * * * *